(12) United States Patent
Shimizu (10) Patent No.: US 11,607,883 B2
(45) Date of Patent: Mar. 21, 2023

(54) PIEZOELECTRIC DEVICE, LIQUID DISCHARGE HEAD, LIQUID DISCHARGE DEVICE, AND METHOD FOR MANUFACTURING PIEZOELECTRIC DEVICE

(71) Applicant: Seiko Epson Corporation, Tokyo (JP)

(72) Inventor: Toshihiro Shimizu, Fujimi-Machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/460,573

(22) Filed: Aug. 30, 2021

(65) Prior Publication Data
US 2022/0063273 A1 Mar. 3, 2022

(30) Foreign Application Priority Data

Aug. 31, 2020 (JP) .............................. JP2020-145460

(51) Int. Cl.
| | | |
|---|---|---|
| *B41J 2/14* | (2006.01) | |
| *B41J 2/16* | (2006.01) | |
| *H01L 41/29* | (2013.01) | |
| *H01L 41/18* | (2006.01) | |
| *H01L 41/09* | (2006.01) | |
| *H01L 41/08* | (2006.01) | |
| *H01L 41/047* | (2006.01) | |

(52) U.S. Cl.
CPC ........... *B41J 2/14233* (2013.01); *B41J 2/161* (2013.01); *B41J 2/164* (2013.01); *H01L 41/0472* (2013.01); *H01L 41/0815* (2013.01); *H01L 41/09* (2013.01); *H01L 41/18* (2013.01); *H01L 41/29* (2013.01)

(58) Field of Classification Search
None
See application file for complete search history.

(56) References Cited

U.S. PATENT DOCUMENTS

| | | | |
|---|---|---|---|
| 10,833,244 B2 | 11/2020 | Yonemura et al. | |
| 2010/0321857 A1* | 12/2010 | Habu | H01L 28/60 361/281 |
| 2011/0063376 A1* | 3/2011 | Morozumi | H01L 41/0805 310/365 |
| 2018/0277742 A1* | 9/2018 | Yonemura | B41J 2/1634 |

FOREIGN PATENT DOCUMENTS

JP 2018-129402 8/2018

* cited by examiner

*Primary Examiner* — Erica S Lin
(74) *Attorney, Agent, or Firm* — Workman Nydegger (57) ABSTRACT

A piezoelectric device includes a piezoelectric body, a vibration plate that vibrates when the piezoelectric body is driven, a first electrode positioned between the piezoelectric body and the vibration plate, and a second electrode positioned to be separated from the first electrode by the piezoelectric body. The piezoelectric body has an active portion that is a part sandwiched between the first electrode and the second electrode in a first direction along a thickness direction of the piezoelectric body, and a change width of a dC/dV value, which represents a change in capacitance with respect to a change in a voltage applied along a second direction orthogonal to the first direction, from one end of the active portion on a side of the first electrode to the other end of the active portion on a side of the second electrode in the first direction is 10% or less.

11 Claims, 6 Drawing Sheets

| SAMPLE | CHANGE WIDTH OF dC/dV VALUE (%) | AMOUNT OF DISPLACEMENT OF VIBRATION PLATE (nm) | RATIO OF AMOUNT OF DISPLACEMENT OF VIBRATION PLATE TO AMOUNT OF DISPLACEMENT OF VIBRATION PLATE OF SAMPLE 4 |
|---|---|---|---|
| 1 | 9 | 695 | 1.07 |
| 2 | 10 | 680 | 1.04 |
| 3 | 5 | 770 | 1.18 |
| 4 | 17 | 653 | — |

FIG. 8

PIEZOELECTRIC DEVICE, LIQUID DISCHARGE HEAD, LIQUID DISCHARGE DEVICE, AND METHOD FOR MANUFACTURING PIEZOELECTRIC DEVICE

The present application is based on, and claims priority from JP Application Serial Number 2020-145460, filed Aug. 31, 2020, the disclosure of which is hereby incorporated by reference herein in its entirety.

BACKGROUND

1. Technical Field

The present disclosure relates to a piezoelectric device, a liquid discharge head, a liquid discharge device, and a method for manufacturing the piezoelectric device.

2. Related Art

Regarding a piezoelectric device, JP-A-2018-129402 discloses a piezoelectric device including a vibration plate and a piezoelectric layer having a movable portion which is a part sandwiched between a first electrode and a second electrode. The piezoelectric device is used, for example, as a component of a liquid discharge head of a liquid discharge device, displaces the vibration plate by deforming a piezoelectric body due to piezoelectric distortion of the movable portion, applies pressure to liquid, such as ink, stored in a pressure generation chamber of the liquid discharge head, and discharges liquid from nozzles that communicates with the pressure generation chamber.

In the piezoelectric device of JP-A-2018-129402, when, in a thickness direction of the movable portion, there is a variation in dielectric characteristics in a direction perpendicular to the thickness direction, the inventors of the present application have found that there are problems in that the amount of deformation of the piezoelectric body decreases due to the piezoelectric distortion, and the amount of displacement of the vibration plate decreases.

SUMMARY

According to a first aspect of the present disclosure, there is provided a piezoelectric device. The piezoelectric device a piezoelectric body that contains piezoelectric ceramics as a main component, a vibration plate that vibrates when the piezoelectric body is driven, a first electrode positioned between the piezoelectric body and the vibration plate, and a second electrode positioned to be separated from the first electrode by the piezoelectric body. The piezoelectric body has an active portion that is a part sandwiched between the first electrode and the second electrode in a first direction along a thickness direction of the piezoelectric body, and a change width of a dC/dV value, which represents a change in capacitance with respect to a change in a voltage applied along a second direction orthogonal to the first direction, from one end of the active portion on a side of the first electrode to the other end of the active portion on a side of the second electrode in the first direction is 10% or less.

According to a second aspect of the present disclosure, there is provided a liquid discharge head. The liquid discharge head includes the piezoelectric device according to the first aspect and a pressure chamber through which liquid flows, and is configured to discharge the liquid in the pressure chamber when the piezoelectric device is driven.

According to a third aspect of the present disclosure, there is provided a liquid discharge device. The liquid discharge device includes the liquid discharge head according to the second aspect, and a controller that controls a discharge operation from the liquid discharge head.

According to a fourth aspect of the present disclosure, there is provided a method for manufacturing a piezoelectric device which includes a vibration plate, a first electrode, a piezoelectric body, and a second electrode laminated in order along a forward direction of a first direction and in which the piezoelectric body contains a perovskite-type complex oxide represented by a general formula $ABO_3$ containing Pb, Zr and, Ti, as a main component. This manufacturing method includes a first step of forming a first precursor layer in the forward direction of the first electrode and forming a first piezoelectric layer of the piezoelectric body by firing the first precursor layer; a second step of laminating a plurality of second piezoelectric layers in the forward direction by alternately executing a step of forming a second precursor layer in the forward direction of the first piezoelectric layer and a step of forming the second piezoelectric layer of the piezoelectric body by firing the second precursor layer a plurality of times; and a third step of forming the second electrode in the forward direction of the piezoelectric body. A molar concentration of Pb in the first precursor layer is 1.10 to 1.30 times a molar concentration of Pb in the second precursor layer.

DESCRIPTION OF EXEMPLARY EMBODIMENTS

A. First Embodiment

Figure 1:
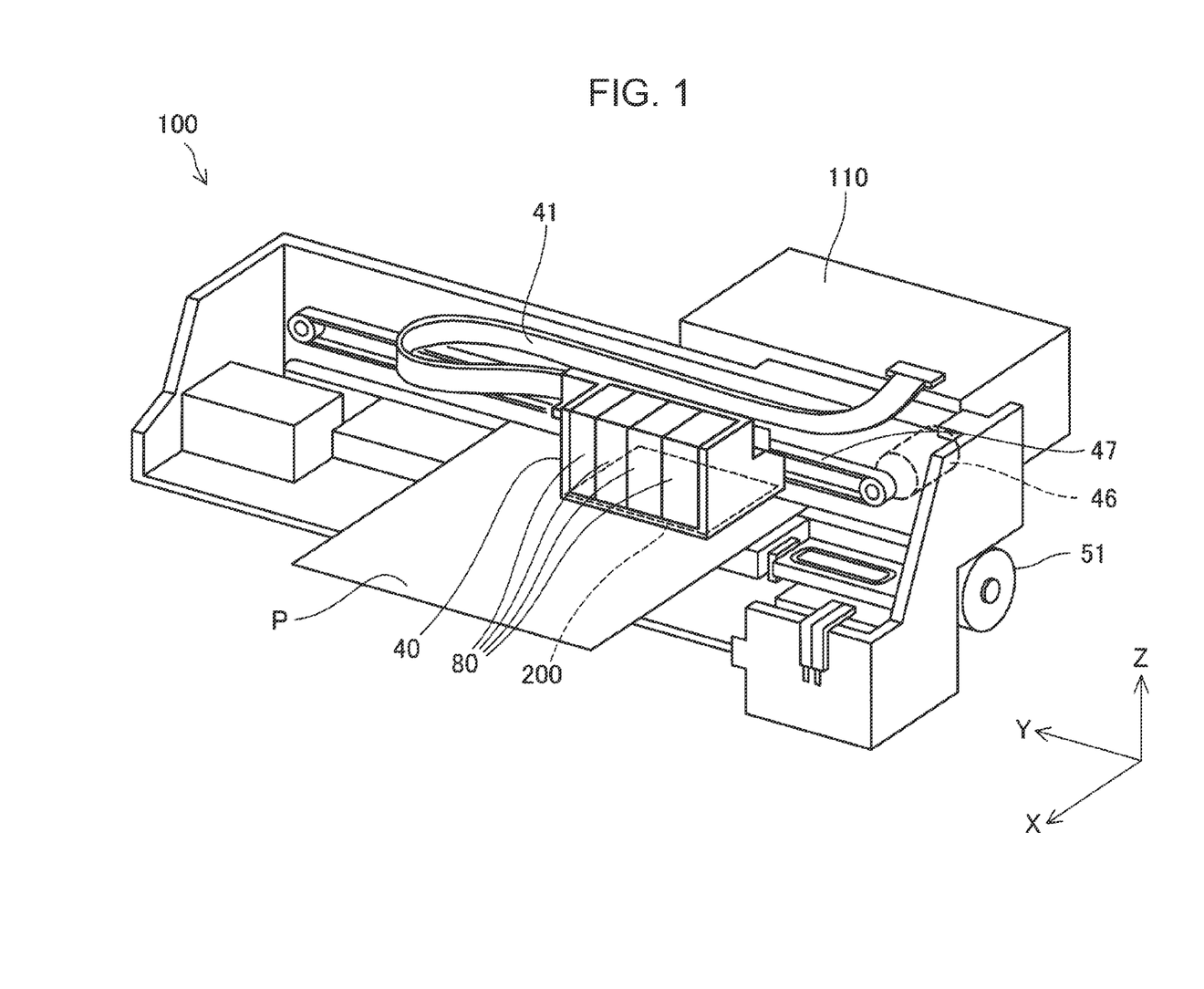
FIG. 1 is an explanatory diagram showing a schematic configuration of a liquid discharge device as a first embodiment.

FIG. 1 is an explanatory diagram showing a schematic configuration of a liquid discharge device 100 as a first embodiment. In FIG. 1, arrows along X, Y, and Z directions orthogonal to each other are shown. The X, Y, and Z directions are directions along an X axis, a Y axis, and a Z axis, which are three spatial axes orthogonal to each other, and each of the X, Y, and Z directions includes both one direction along the X axis, the Y axis, and the Z axis, and an opposite direction thereof. Specifically, positive directions along the X axis, the Y axis, and the Z axis are +X direction, +Y direction, and +Z direction, respectively, and negative directions along the X axis, Y axis, and Z axis are −X direction, −Y direction, and −Z direction, respectively. In FIG. 1, the X axis and the Y axis are axes along a horizontal plane, and the Z axis is an axis along a vertical line. Therefore, in the present embodiment, the −Z direction is a direction of gravity. In other drawings, arrows along the X, Y, and Z directions are appropriately represented. The X, Y, and Z directions in FIG. 1 and the X, Y, and Z directions in other drawings represent the same directions. Further, in the present specification, orthogonality includes a range of 90°±10°.

The liquid discharge device 100 according to the present embodiment is an ink jet printer that prints an image on a print medium P by discharging ink as liquid. The liquid discharge device 100 ejects ink onto the print medium P, such as paper, based on print data indicating on/off of dots in the print medium P, and forms the dots at various positions on the print medium P, thereby printing an image on the print medium P. As the print medium P, for example, plastics, a film, fibers, a cloth, leather, metal, glass, wood, ceramics, or the like, which can hold liquid, can be used in addition to paper. Further, as liquid of the liquid discharge device 100, any liquid, such as various coloring materials, electrode materials, samples including bioorganic substances and inorganic substances, lubricating oil, resin liquid, and etching liquid can be used in addition to ink.

The liquid discharge device 100 includes a liquid discharge head 200, a carriage 40, a drive motor 46 for driving the carriage 40, a transport motor 51 for transporting the print medium P, an ink cartridge 80, and a controller 110.

The controller 110 includes a computer having one or more processors, a main storage device, and an input and output interface that inputs and outputs signals to and from the outside. The controller 110 discharges ink from the liquid discharge head 200 onto the print medium P to print an image on the print medium P by controlling each mechanism provided in the liquid discharge device 100 according to the print data. That is, the controller 110 controls the liquid discharge head 200 to perform a discharge operation of discharging the liquid.

The ink cartridge 80 stores ink as liquid to be supplied to the liquid discharge head 200. In the present embodiment, the four ink cartridges 80 are composed to be detachably attached to the carriage 40, and four types of ink having different colors are stored in the four ink cartridges 80, respectively, as liquid. The ink cartridge 80 may be mounted on, for example, a main body of the liquid discharge device 100 without being mounted on the carriage 40. Further, in another embodiment, a mechanism that stores ink may be, for example, an ink tank, a bag-shaped liquid pack formed of a flexible film, or the like, and the types and number of mechanisms that store ink and the types and number of inks to be stored are not particularly limited.

The liquid discharge head 200 according to the present embodiment is held by the carriage 40 and reciprocates together with the carriage 40 in a main scanning direction due to driving force transmitted from the drive motor 46 to the carriage 40 via a drive belt 47. The liquid discharge head 200 discharges ink supplied from the ink cartridge 80 in the form of droplets on the print medium P transported along a sub scanning direction intersecting the main scanning direction by a transport motor 51 and a roller (not shown) while reciprocating in the main scanning direction. In the present embodiment, the main scanning direction is a direction along the Y direction. The sub scanning direction is a direction along the X direction and is orthogonal to the main scanning direction. In another embodiment, the main scanning direction and the sub scanning direction may not be orthogonal to each other. The liquid discharge head 200 is electrically connected to the controller 110 via a flexible cable 41. Details of the liquid discharge head 200 will be described later. Further, the liquid discharge device 100 may include two or more liquid discharge heads 200. Further, the liquid discharge device 100 may be equipped with, for example, the liquid discharge head 200 over an entire width of the print medium P, and may perform printing using a single-pass method for performing printing by transporting the print medium P without driving the liquid discharge head 200.

Figure 2:
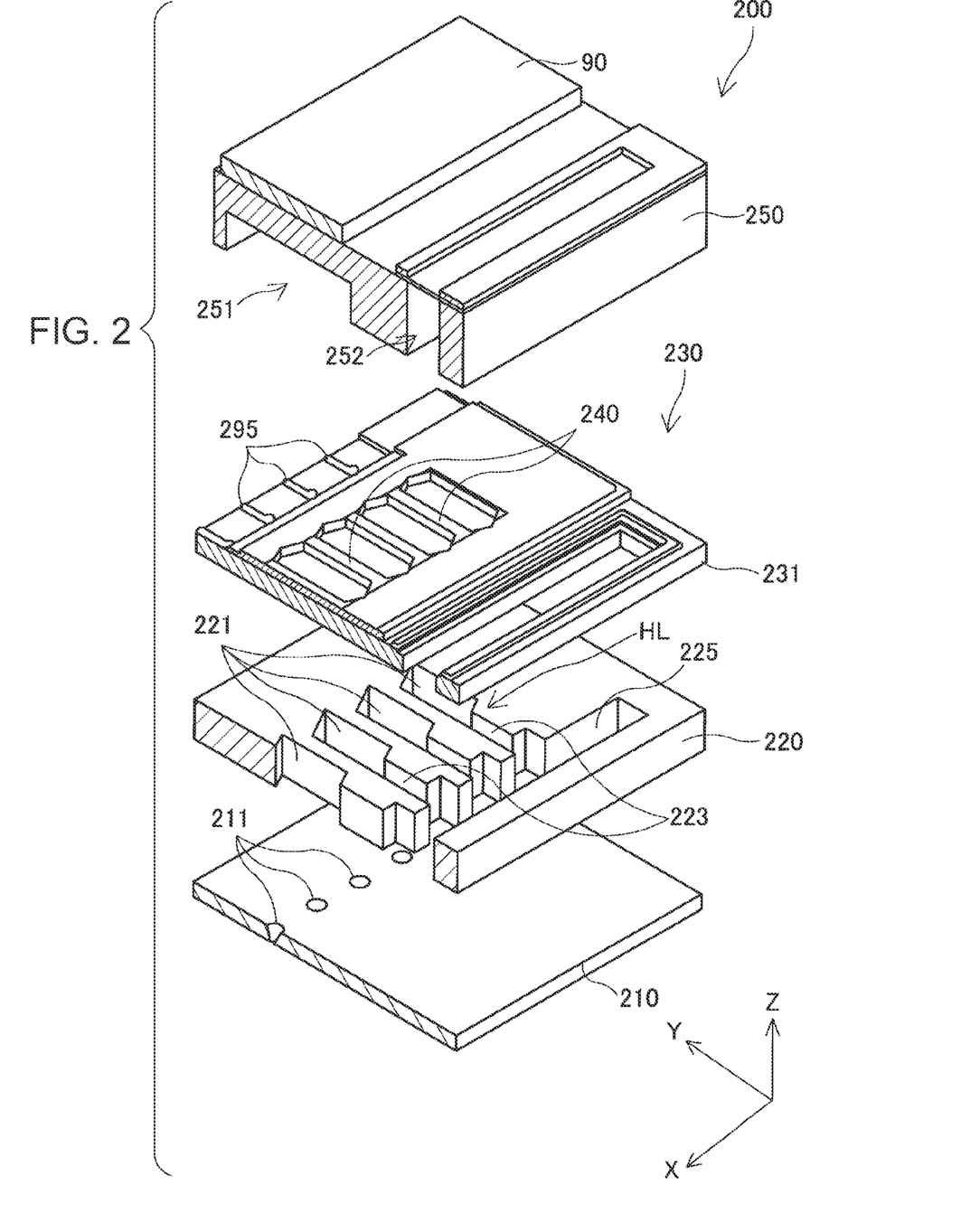
FIG. 2 is an exploded perspective diagram showing a configuration of a liquid discharge head according to the present embodiment.

FIG. 2 is an exploded perspective diagram showing a configuration of the liquid discharge head 200 according to the present embodiment. The liquid discharge head 200 according to the present embodiment includes a nozzle plate 210, a pressure chamber substrate 220, a piezoelectric portion 230, and a sealing portion 250 which are laminated in the Z direction. A drive circuit 90 is provided on a surface of the sealing portion 250 on a side of the +Z direction.

The nozzle plate 210 according to the present embodiment is a thin plate-shaped member, and is disposed along the X direction and the Y direction. A plurality of nozzles 211 are formed in a row on the nozzle plate 210 along the X direction. The liquid discharge head 200 ejects liquid from the nozzles 211. In the present embodiment, the nozzle plate 210 is formed of stainless steel (SUS). The nozzle plate 210 may be formed of, for example, another type of metal such as a nickel (Ni) alloy, a resin material such as polyimide or a dry film resist, or an inorganic material such as a single crystal substrate of silicon (Si) or glass ceramics. Further, two or more rows of nozzles 211 may be formed on the nozzle plate 210.

The pressure chamber substrate 220 is a plate-shaped member that partitions flow paths such as pressure chambers 221. The pressure chamber substrate 220 is joined to, for example, a surface of the nozzle plate 210 in the +Z direction directly or via an adhesive, a heat welding film, or the like. The pressure chamber substrate 220 is formed with holes HL penetrating the pressure chamber substrate 220 in the Z direction to form the pressure chambers 221, ink supply paths 223, and a communication portion 225. For example, some or all of the holes HL may be formed after laminating a vibration plate 231, which will be described later, on the pressure chamber substrate 220. In the present embodiment, the pressure chamber substrate 220 is formed of a single crystal substrate of Si. The pressure chamber substrate 220 may be a substrate formed of, for example, another material containing Si as a main component, another ceramic material, a glass material, or the like. The main component refers to a component contained 50% or more, preferably, 80% or more in a certain material.

In the present embodiment, the plurality of pressure chambers 221 are formed to be arranged side by side along the X direction. Since the pressure chamber substrate 220 is laminated on the nozzle plate 210, each of the plurality of pressure chambers 221 communicates with each of the plurality of nozzles 211. Each of the pressure chambers 221 has a substantially parallel quadrilateral shape with the Y direction as a longitudinal direction when viewed from the Z direction. Ink as the liquid flows in the pressure chambers 221.

The communication portion 225 is an empty portion common to each of the plurality of pressure chambers 221 and communicates with the plurality of pressure chambers 221 and the like to form a common liquid chamber which will be described later. The communication portion 225 communicates with the plurality of respective pressure chambers 221 via the ink supply paths 223. The ink supply paths 223 each has a part formed to have a width narrower than that of the pressure chamber 221 to suppress pressure loss generated in the pressure chamber 221 and so-called crosstalk in which pressure generated in each pressure chamber 221 propagates to another pressure chamber 221 via the common liquid chamber.

The piezoelectric portion 230 is composed by laminating the vibration plate 231 and piezoelectric elements 240 on the pressure chamber substrate 220. The piezoelectric portion 230 according to the present embodiment can vibrate the vibration plate 231 provided between the piezoelectric elements 240 and the pressure chamber substrate 220 by deforming the piezoelectric elements 240 to change the volume of the pressure chamber 221. Details of the piezoelectric portion 230 will be described later. The piezoelectric portion 230 may also be referred to as a piezoelectric device or an actuator.

The sealing portion 250 is joined to the piezoelectric portion 230 via the adhesive. The sealing portion 250 includes a piezoelectric element holding portion 251 that holds the piezoelectric elements 240, and a manifold portion 252 that communicates with the communication portion 225 of the pressure chamber substrate 220 to form the common liquid chamber. In the present embodiment, the sealing portion 250 is formed by using the single crystal substrate of Si. The sealing portion 250 may be formed of another ceramic material, glass material, or the like. In this case, it is preferable that the sealing portion 250 is formed of a material having a thermal expansion coefficient substantially identical to that of the pressure chamber substrate 220.

The drive circuit 90 supplies a drive signal for driving the piezoelectric element 240 to the piezoelectric element 240. As the drive circuit 90, for example, a circuit substrate, a semiconductor integrated circuit (IC), or the like can be used. The drive circuit 90 is electrically connected to the piezoelectric element 240 via a lead electrode 295 and an electric wiring (not shown). Further, the drive circuit 90 is electrically connected to the controller 110 via the electrical wiring (not shown).

Figure 3:
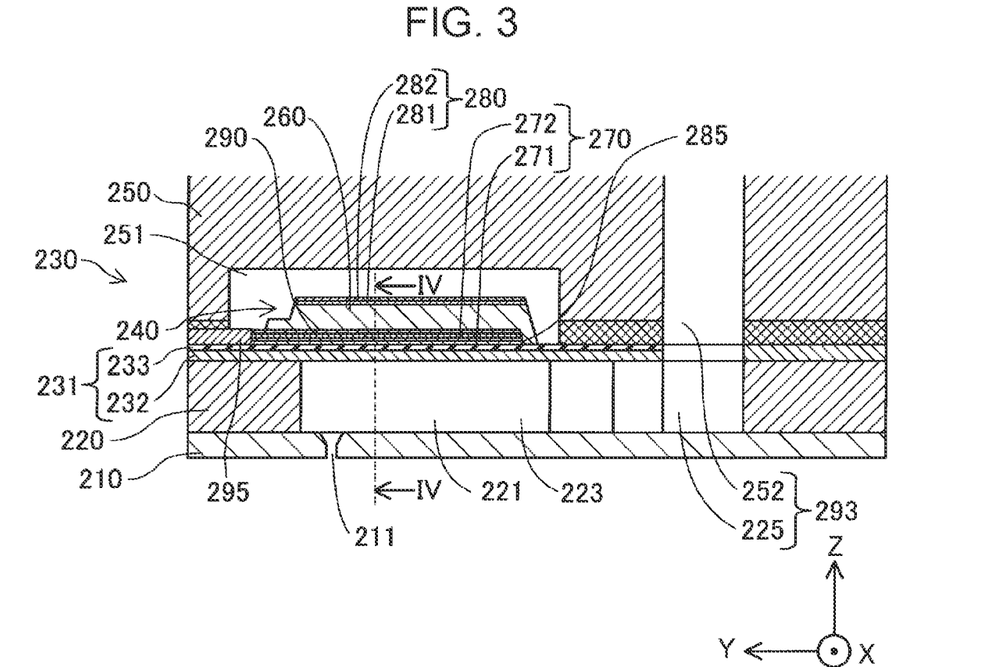
FIG. 3 is a schematic diagram showing a cross section of a main part of the liquid discharge head.

FIG. 3 is a schematic diagram showing a cross section of a main part of the liquid discharge head 200 along the Y direction and the Z direction. As shown in FIG. 3, the manifold portion 252 communicates with the communication portion 225 when the above-described respective members are laminated, and a manifold 293 is formed that serves as the liquid chamber which is common to each of the plurality of pressure chambers 221. Further, the nozzles 211, the pressure chambers 221, the ink supply paths 223, and the manifold 293 communicate with each other, so that ink flow path is formed. The liquid discharge head 200 discharges liquid supplied to the pressure chamber 221 through the above-described flow paths from the nozzles 211 by changing the volume of the pressure chamber 221 by the piezoelectric portion 230. The manifold 293 may be referred to as the common liquid chamber or a reservoir.

Figure 4:
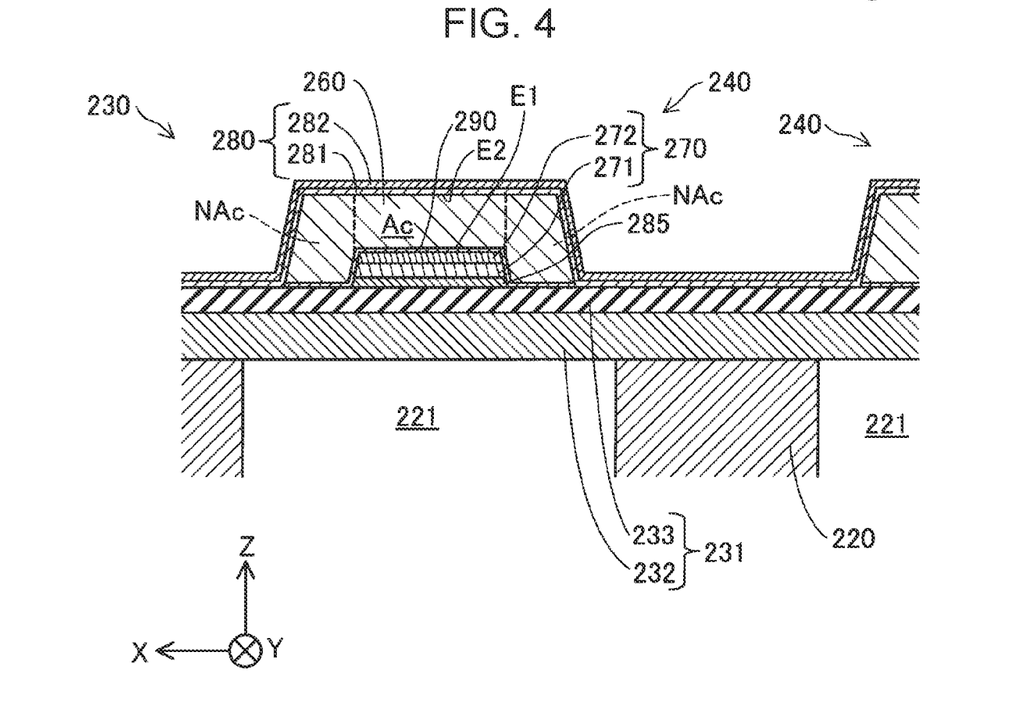
FIG. 4 is a cross-sectional diagram showing a pressure chamber and a piezoelectric portion in FIG. 3, which are taken along a line IV-IV.

FIG. 4 is a cross-sectional diagram showing the pressure chamber 221 and the piezoelectric portion 230 in FIG. 3, which are taken along a line IV-IV. As described above, the piezoelectric portion 230 includes the vibration plate 231 and the piezoelectric element 240. The piezoelectric element 240 includes a piezoelectric body 260, a plurality of first electrodes 270, and a plurality of second electrodes 280.

Further, the piezoelectric element according to the present embodiment further includes an adhesion layer 285 and a seed layer 290.

As shown in FIGS. 3 and 4, the vibration plate 231, the piezoelectric body 260, the first electrode 270, and the second electrode 280 are laminated in a first direction along a thickness direction of the piezoelectric body 260. The first direction is a direction along the Z axis, and is a direction in which the +Z direction is a forward direction. Hereinafter, the forward direction of the first direction may be simply referred to as the "forward direction". The first electrode 270 is positioned between the piezoelectric body 260 and the vibration plate 231. The second electrode 280 is disposed to be separated from the first electrode 270 while interposing the piezoelectric body 260 therebetween. That is, the vibration plate 231, the first electrode 270, the piezoelectric body 260, and the second electrode 280 are laminated in this order along the forward direction. As in the present embodiment, the liquid discharge head 200 is generally used in a state where the nozzle 211 is positioned vertically downward. Here, there is a case where the first electrode 270 is referred to as a lower electrode and the second electrode 280 is referred to as an upper electrode. Further, in another embodiment, for example, the nozzle plate 210 may function as the vibration plate. Here, the nozzle plate 210 as the vibration plate, the first electrode 270, the piezoelectric body 260, and the second electrode 280 may be laminated in this order toward the −Z direction.

In the present embodiment, the Y direction may be referred to as a second direction. The second direction is a direction orthogonal to the first direction, and includes both one direction and an opposite direction thereof along the same axis. In the present embodiment, the positive and negative directions of the second direction coincide with the positive and negative directions of the Y direction. In another embodiment, the second direction may be a direction different from the Y direction as long as the direction is orthogonal to the first direction, and may be, for example, an X direction or a direction intersecting the X direction and the Y direction.

As described above, the vibration plate 231 is composed to vibrate due to the deformation of the piezoelectric element 240. Specifically, the vibration plate 231 vibrates when the piezoelectric body 260 is electrically driven via the first electrode 270 and the second electrode 280. As shown in FIGS. 3 and 4, the vibration plate 231 according to the present embodiment includes a first layer 232 and a second layer 233. The second layer 233 is positioned at a position closer to the piezoelectric body 260 than the first layer 232 in the Z direction. Specifically, the first layer 232 is positioned on the pressure chamber substrate 220 and the pressure chamber 221 and the second layer 233 is positioned on the first layer 232. The first layer 232 is an elastic film containing silica ($SiO_2$) as a main component, and the second layer 233 is an insulating film containing zirconia ($ZrO_2$) as a main component. The first layer 232 may be referred to as an elastic layer, and the second layer 233 may be referred to as an insulating layer or a protective layer.

In the present embodiment, a plurality of first electrodes 270 are individually provided for the plurality of pressure chambers 221. The second electrode 280 is commonly provided for the plurality of pressure chambers 221. The electrodes individually provided for the plurality of pressure chambers 221 may be referred to as individual electrodes, and the electrode commonly provided may be referred to as a common electrode. That is, in the present embodiment, the first electrodes 270, which are the lower electrodes, are the individual electrodes, and the second electrode 280, which is the upper electrode, is the common electrode. As shown in FIGS. 3 and 4, each of the first electrodes 270 is disposed with the Y direction as the longitudinal direction. Further, the plurality of first electrodes 270 are arranged along the X direction. The second electrode 280 is continuously provided in the X direction and the Y direction over the plurality of pressure chambers 221 so as to cover the piezoelectric body 260 from an upper portion.

The first electrode 270 according to the present embodiment is formed in such a way that a platinum (Pt) layer 271 and a first Ir layer 272 made of iridium (Ir) are laminated in this order along the forward direction. The second electrode 280 is formed in such a way that a second Ir layer 281 made of Ir and a Ti layer 282 are laminated in this order along the forward direction. In another embodiment, the first electrode 270 may be formed of, for example, a conductive oxide or the like represented by a metal such as nickel (Ni) or palladium (Pd), or a lanthanum nickel oxide (LNO), in addition to the above Ir, Pt, and Ti. Further, the second electrode 280 may be formed of, for example, a metal material, such as Pd or gold (Au), in addition to the above Ti and Ir. The first electrode 270 and the second electrode 280 may be formed of, for example, a single material, may be formed of a composite material in which a plurality of materials are mixed, or may be formed in such a way that a plurality of materials are laminated as in the present embodiment.

The adhesion layer 285 is provided to improve adhesion property between the vibration plate 231 and the piezoelectric element 240. As shown in FIG. 3 and FIG. 4, in the present embodiment, the adhesion layer 285 is provided between the vibration plate 231 and the first electrode 270 to improve adhesion property between the vibration plate 231 and the first electrode 270. The adhesion layer 285 according to the present embodiment is formed of Ti and titanium oxide ($TiO_x$). The adhesion layer 285 is formed of, for example, silicon nitride (SiN), in addition to Ti and $TiO_x$.

FIG. 4 shows an active portion Ac and an inactive portion NAc. The active portion Ac is a part of the piezoelectric body 260, which is sandwiched by the first electrode 270 and the second electrode 280 in the Z direction. The inactive portion NAc is a part of the piezoelectric body 260, which is not sandwiched between the first electrode 270 and the second electrode 280 in the Z direction. Therefore, the inactive portion NAc is a part of the piezoelectric body 260 in which both the first electrode 270 and the second electrode 280 are not provided in the Z direction of the piezoelectric body 260, or a part in which only one of the first electrode 270 and the second electrode 280 is provided.

In the active portion Ac of the piezoelectric body 260, piezoelectric distortion occurs when a voltage is applied to the piezoelectric body 260 via the first electrode 270 and the second electrode 280. The piezoelectric elements 240 change the volume of the pressure chamber 221 due to the displacement caused by the piezoelectric distortion. Specifically, the piezoelectric elements 240 deform the vibration plate 231 by the piezoelectric distortion of the piezoelectric body 260 to change the volume of the pressure chamber 221. In the inactive portion NAc of the piezoelectric body 260, the piezoelectric distortion does not occur even when the voltage is applied to the piezoelectric body 260.

The piezoelectric body 260 contains piezoelectric ceramics as a main component. In the present embodiment, the piezoelectric body 260 is made of lead zirconate titanate-based complex oxide (PZT). PZT is a perovskite-type complex oxide having a perovskite structure represented by the general formula $ABO_3$ containing lead (Pb), zirconium (Zr), and Ti. In general, it is known that PZT is superior in piezoelectric characteristics such as the amount of deformation due to the piezoelectric distortion, as compared with other piezoelectric bodies. The piezoelectric body 260 according to the present embodiment is formed of PZT represented by the following formula (1).

$$Pb_x(Zr_y,Ti_{1-y})O_3 \tag{1}$$

(In the formula, $0.95 \leq x \leq 1.22$ is satisfied.)

In the formula (1), for example, x=1.22 represents that 122% by mol of Pb is contained when the amount of Pb in the composition of stoichiometry is 100% by mol. That is, in this case, the excess amount of Pb with respect to the composition of stoichiometry is 22% by mol. Further, x=0.95 represents that 95% by mol of Pb is contained when the amount of Pb in the composition of stoichiometry is 100% by mol. That is, the deficiency of Pb with respect to the composition of stoichiometry is 0.05% by mol. When Pb at an A site is neither excessive nor deficient with respect to the composition of stoichiometry, x=1.

Generally, PZT is manufactured by adding an excessive amount of Pb to the amount of Pb that does not cause excess or deficiency in stoichiometry from a viewpoint of reducing lattice defects caused by volatilization of Pb during the manufacturing process. On the other hand, when Pb is excessively contained in PZT, it is known that the excess Pb is present at a B site and becomes a p-type dopant. In this case, a phenomenon occurs in which a part of the current flowing through PZT leaks when the voltage is applied, and the amount of leakage of the current is proportional to the excess amount of Pb without the contribution of other factors. Therefore, from a viewpoint of improving the piezoelectric characteristics while achieving both reduction of lattice defects and leakage amount of PZT, a value of x in the formula (1) is preferably 0.97 or more, and, further preferably, 0.99 or more. The value of x in the formula (1) is preferably 1.21 or less, and, more preferably, 1.20 or less.

In the piezoelectric body 260 made of PZT, it is preferable that a Zr ratio, which is a ratio of the molar amount of Zr to a total of the molar amount of Zr and the molar amount of Ti, is 0.4 or more and is 0.6 or less from the viewpoint of improving the piezoelectric characteristics. That is, in the formula (1), it is preferable that $0.4 \leq y \leq 0.6$ is satisfied. Further, in order to improve the amount of deformation of the piezoelectric body 260 made of PZT due to the piezoelectric distortion, the Zr ratio is preferably 0.52 or less. In this case, a crystal structure of PZT is tetragonal, and the amount of deformation of PZT due to the piezoelectric distortion is improved, as compared with a case where the Zr ratio exceeds 0.52 and the crystal structure of PZT is a rhombohedral crystal. Therefore, in the formula (1), it is further preferable to satisfy $0.4 \leq y \leq 0.52$. Further, in PZT, a morphotropic phase boundary (MPB) exists between tetragonal crystals and the rhombohedral crystals in the vicinity of y=0.52 in the formula (1), and, in general, PZT exhibits higher piezoelectric characteristics when y=0.52, so that it is further preferable to satisfy y=0.52 in the formula (1).

A piezoelectric material consisting of the piezoelectric body 260 may be any PZT-based complex oxide, and is not limited to the composition represented in the formula (1). For example, an A site and a B site of PZT may contain other metallic elements. Examples of such other metallic elements include manganese (Mn), lithium (Li), barium (Ba), calcium (Ca), strontium (Sr), bismuth (Bi), tantalum (Ta), antimony (Sb), Iron (Fe), cobalt (Co), silver (Ag), magnesium (Mg), zinc (Zn), copper (Cu), and the like. PZT may contain one kind of the other metallic elements, or may contain two or more kinds of the other metallic elements. By using additives, it becomes easier to improve various characteristics to diversify configurations and functions. On the other hand, in order for the piezoelectric body 260 to exhibit excellent piezoelectric characteristics, the molar amount of other metallic elements with respect to the molar amount of PZT excluding other metallic elements is 20% or less, preferably 15% or less, and further preferably 10% or less.

The piezoelectric material also includes a material having a composition in which some of the elements are deficient, a material having a composition in which some of the elements are in excess, and a material having a composition in which some of the elements are replaced with other elements. As long as basic characteristics of the piezoelectric body 260 are not changed, a material deviating from the composition of stoichiometry due to deficiency or excess or a material, in which some of the elements are replaced with other elements, is also included in the piezoelectric material according to the present embodiment.

Further, PZT may be a mixed crystal with another complex oxide having an $ABO_3$-type perovskite structure. Although another complex oxide is not particularly limited, for example, lead zirconate titanate, to which metallic elements such as niobium, nickel, and magnesium are added, can be used, and lead titanate ($PbTiO_3$), zirconium Lead acid ($PbZrO_3$), lanthanum lead titanate ($(Pb, La) TiO_3$), lanthanum lead zirconate titanate ($(Pb, La) (Zr, Ti)O_3$), magnesium zirconium niobate lead titanate ($Pb(Zr, Ti) (Mg, Nb)O_3$), or the like can be used.

The seed layer 290 is provided to control orientation of the crystal of the piezoelectric body 260. As shown in FIGS. 3 and 4, in the present embodiment, a part of the seed layer 290 that overlaps the active portion Ac of the piezoelectric body 260 in the X direction and the Y direction is provided between the piezoelectric body 260 and the first electrode 270, and a part that overlaps the inactive portion NAc of the piezoelectric body 260 in the X direction and the Y direction is provided between the piezoelectric body 260 and the second layer 233 of the vibration plate 231.

The seed layer 290 according to the present embodiment has the perovskite structure represented by the general formula $ABO_3$ and is made of a complex oxide that is self-oriented on the (100) plane. More specifically, the seed layer 290 contains $LaNiO_3$ (LNO) as a main component. The seed layer 290 containing LNO as a main component as in the present embodiment may contain, for example, $La_3Ni_2O_6$, $LaNiO_2$, $La_2NiO_4$, $La_3Ni_2O_7$, $La_4Ni_3O_{10}$, and the like which are generated when LNO is formed. The piezoelectric body 260 formed on the seed layer 290 is preferentially oriented toward the (100) plane by the seed layer 290. It is generally known that the piezoelectric characteristics of the piezoelectric body 260 are improved when the piezoelectric body 260 is preferentially oriented to the (100) plane, as compared with, for example, the case where the piezoelectric body 260 is oriented to the (111) plane or the (110) plane or a case where the piezoelectric body 260 is not preferentially oriented to a specific plane. The preferential orientation refers that the crystals, which are 50% or more and, further preferably, 80% or more, are oriented to a predetermined crystal plane. The "self-orientation" refers to a state in which an object is preferentially oriented in a certain direction without being affected by ground. In another embodiment, for example, a complex oxide such as $Bi(Fe, Ti)O_3$ (BFT) may be used as the seed layer 290. Since BFT has the perovskite structure as the same as LNO and is self-oriented to the (100) plane, the piezoelectric body 260 can be preferentially oriented to the (100) plane as the same as LNO.

The piezoelectric body 260 according to the present embodiment contains columnar crystals of PZT with the first direction as the longitudinal direction. When the piezoelectric body 260 contains the columnar crystals, a withstand voltage of the piezoelectric body 260 is improved as compared with, for example, a case where the piezoelectric body 260 does not contain the columnar crystals but contains only granular crystals. The columnar crystals are more likely to be formed when the piezoelectric body 260 is orientation-controlled and is formed on the seed layer 290 which is self-oriented to the (100) plane of LNO or BFT described above.

In the piezoelectric element 240, it is preferable that a thickness of the first layer 232 is 0.1 μm or more and is 2.0 μm or less, a thickness of the second layer 233 is 0.01 μm or more and is 1.0 μm or less, and a thickness of the piezoelectric body 260 is 0.1 μm or more and is 5.0 μm or less, a thickness of the first electrode 270 is 0.01 μm or more and is 1.0 μm or less, and a thickness of the second electrode 280 is 0.01 μm or more and is 1.0 μm or less. When the adhesion layer 285 is formed as in the present embodiment, it is preferable that a thickness of the adhesion layer 285 is 0.005 μm or more and is 0.1 μm or less, and, when the seed layer 290 is formed, it is preferable that a thickness of the seed layer 290 is 0.08 μm or less, and, preferably, is 0.01 μm or more and is 0.05 μm or less. The thickness of each of the elements is an example, and can be changed without changing the gist of the present disclosure.

FIG. 4 shows one end E1 and the other end E2 of the active portion Ac in the first direction. As a result of diligent studies on the piezoelectric characteristics of the piezoelectric body 260, the inventors of the present disclosure pay attention to a change width of a dC/dV value in the second direction between the one end E1 and the other end E2 in the active portion Ac, and find that the amount of deformation of the piezoelectric portion 230 due to the piezoelectric distortion can be evaluated. Further, it is found that, in a case where the change width of the dC/dV value in the active portion Ac is 10% or less, the amount of deformation of the piezoelectric portion 230 is increased as compared with the case where the change width of the dC/dV value exceeds 10%. Although the one end E1 is positioned in the −Z direction of the other end E2 in the present embodiment, a positional relationship between the one end E1 and the other end E2 may be reversed in other embodiments.

The dC/dV value is a value that indicates a change in capacitance with respect to a change in an AC voltage which is measured using a scanning probe microscope (SPM). More specifically, the dC/dV value is measured by applying the AC voltage to a sample while scanning a surface of the sample with an SPM probe, and by detecting the change in the capacitance of the sample with respect to the change in the applied voltage with the probe. A variation in dielectric characteristics in a direction perpendicular to the thickness direction of the sample can be evaluated by measuring the dC/dV value by applying the AC voltage in the direction perpendicular to the thickness direction of the sample while scanning the surface of the sample with the probe along the thickness direction of the sample. In the present embodiment, the dC/dV value is measured by scanning microwave impedance microscopy (sMIM).

Figure 5:
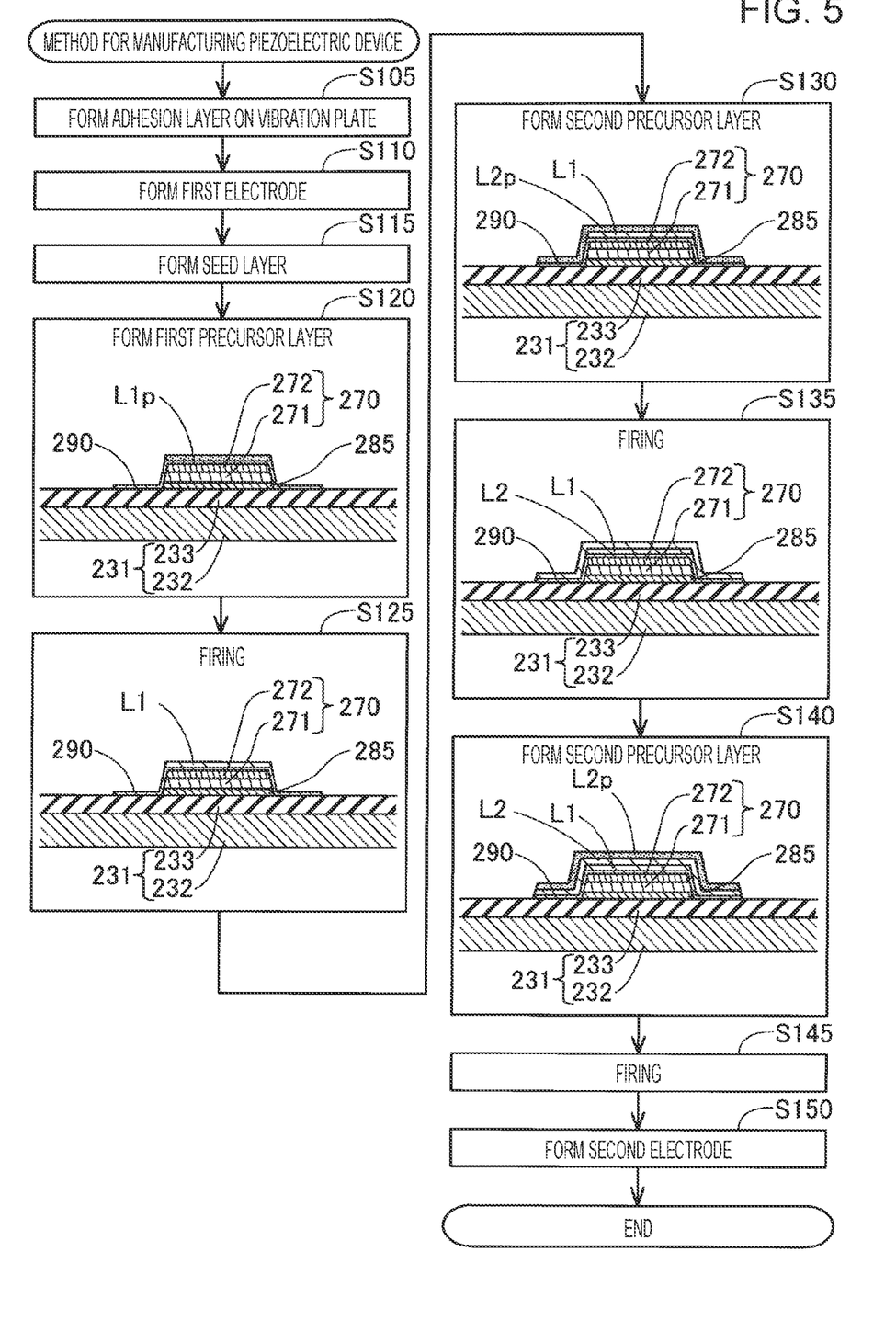
FIG. 5 is a diagram showing an example of a method for manufacturing a piezoelectric device according to the present embodiment.

FIG. 5 is a diagram showing an example of a method for manufacturing the piezoelectric device according to the present embodiment. First, in step S105, the adhesion layer 285 is formed on the vibration plate 231. The adhesion layer 285 is formed by, for example, $TiO_x$ generated by sputtering using Ti as a target material or thermal oxidation of Ti. The first layer 232 of the vibration plate 231 according to the present embodiment is formed on the pressure chamber substrate 220 by, for example, the thermal oxidation or a CVD method, and the second layer 233 is formed on the first layer 232 by the CVD method.

In step S110, the first electrode 270 is formed on the adhesion layer 285 on the vibration plate 231 by sputtering, etching, or the like. In the present embodiment, first, a Pt layer 271 is formed on the adhesion layer 285 by sputtering in which Pt is used as the target material, and the first Ir layer 272 is formed on the Pt layer by sputtering in which Ir is used as the target material, so that the first electrode 270 is formed. Next, the formed Pt layer 271 and the first Ir layer 272 are patterned by etching using masking with a photoresist or the like.

In step S115, the seed layer 290 is formed on the first electrode 270 and the vibration plate 231. The seed layer 290 is formed by, for example, a liquid phase method such as a metal organic compound decomposition (MOD) method or a sol-gel method, a laser ablation method, a sputtering method, a pulse laser deposition (PLD) method, a CVD method, an aerosol deposition method, or the like.

In step S120 and step S125, a first piezoelectric layer L1 is formed by the liquid phase method. The first piezoelectric layer L1 is a layer consisting a part of the piezoelectric body 260, which is formed in the middle of a step of forming the piezoelectric body 260. First, in step S120, a first precursor layer L1$p$, which is a precursor layer of the first piezoelectric layer L1, is formed in a forward direction of the first electrode 270. In the present embodiment, the first precursor layer L1$p$ is formed by coating an upper surface of the seed layer 290 formed on the first electrode 270 with a first precursor liquid that is a precursor liquid for forming the first precursor layer Lip. The precursor layer is a layer made of a precursor liquid of the piezoelectric body 260. The precursor liquid is a sol or solution containing an organometallic compound containing the metallic element that is a raw material of the piezoelectric body 260, that is, the sol or the solution that is a raw material for forming PZT.

In step S125, the first precursor layer L1$p$ is fired. In step S125, the first precursor layer L1$p$ is fired using, for example, an infrared lamp, a firing furnace, a hot plate, or the like. It is preferable that a firing temperature in step S125 is 650° C. to 800° C. In step S125, the organic component contained in the first precursor layer Lip is separated from the first precursor layer L1$p$, and the first piezoelectric layer L1 is formed. Step S120 and step S125 may be referred to as a first step.

From step S130 to step S145, a plurality of second piezoelectric layers L2 are formed in a forward direction of the first piezoelectric layer L1. The second piezoelectric layer L2 is a layer consisting of a part of the piezoelectric body 260 as the same as the first piezoelectric layer L1. From step S130 to step S145, each second piezoelectric layer L2 is formed by the liquid phase method as the same as the first piezoelectric layer L1. First, in step S130, a second precursor layer L2$p$, which is the precursor layer of the second piezoelectric layer L2, is formed on the first piezoelectric layer L1. More specifically, in step S130, the second precursor layer L2$p$ is formed by coating an upper surface of the first piezoelectric layer L1 with a second precursor liquid that is a precursor liquid for forming the second precursor layer L2$p$. Further, in step S130 according to the present embodiment, the second precursor layer L2$p$ is formed on the upper surface of the first piezoelectric layer L1, and the second precursor layer L2$p$ is formed on a part of an area on the vibration plate 231, which does not overlap the first electrodes 270 in the X direction and the Y direction.

A molar concentration of Pb in the second precursor layer L2$p$ is less than a molar concentration of Pb in the first precursor layer L1$p$. Specifically, the molar concentration of Pb in the first precursor layer L1$p$ is adjusted from 1.10 times to 1.30 times the molar concentration of Pb in the second precursor layer L2$p$. The molar concentration of Pb in the first precursor layer L1$p$ and the molar concentration of Pb in the second precursor layer L2$p$ are adjusted by adjusting, for example, the molar concentration of Pb in the first precursor liquid and the molar concentration of Pb in the second precursor liquid, respectively.

The second precursor layer L2$p$ is fired in step S135. Step S135 is the same as the step of firing the first precursor layer L1$p$ in step S125. In step S135, a first layer of the second piezoelectric layer L2 is formed.

In step S140 and step S145, a second layer of the second piezoelectric layer L2 is formed on the first layer of the second piezoelectric layer L2 as the same as the first layer of the second piezoelectric layer L2 formed in step S130 and step S135. As shown from step S130 to step S145, a plurality of second piezoelectric layers L2 are laminated in the forward direction of the first piezoelectric layer L1 by alternately executing a step of forming the second precursor layer L2$p$ and a step of forming the second piezoelectric layer L2 by firing the second precursor layer L2$p$ a plurality of times. After step S145, a third layer, a fourth layer and subsequent layers of the second piezoelectric layer L2 may be formed in order on the second layer of the second piezoelectric layer L2 in the same manner. As in step S130 to step S145, a step of laminating the plurality of second piezoelectric layers L2 in the forward direction may be referred to as a second step.

In step S150, the second electrode 280 is formed on the piezoelectric body 260 by sputtering, etching, or the like. For example, when the first piezoelectric layer L1 and the second piezoelectric layer L2 corresponding to nine layers are formed prior to step S150, the second electrode 280 is formed on a ninth layer of the second piezoelectric layer L2. First, the second Ir layer 281 is formed on the piezoelectric body 260 by sputtering using Ir as the target material, and the Ti layer 282 is formed on the Ir layer by sputtering using Ti as the target material. Next, the formed second Ir layer 281 and the Ti layer 282 are appropriately patterned by etching or the like. Therefore, the piezoelectric device is completed. The step S150 may be referred to as a third step. Further, in each step from step S105 to step S150, for example, etching or the like may be appropriately performed for smoothing the surface of each member and adjusting the thickness.

When the piezoelectric body 260 made of PZT is formed by the liquid phase method as in the manufacturing method shown in FIG. 5, it is known that Pb contained in the precursor layer is diffused to the first electrode 270 formed prior to the precursor layer, the vibration plate 231, the adhesion layer 285, the seed layer 290, and the like in the step of firing the precursor layer of the piezoelectric body 260. As a result, it is considered that the variation in a content of Pb occurs between the one end E1 and the other end E2 of the active portion Ac, and variation in the local dielectric characteristics occurs.

In the piezoelectric device manufactured by the manufacturing method shown in FIG. 5, for example, as compared with a case where the content of Pb in the first precursor layer L1p is equal to the content of Pb in the second precursor layer L2p, the change width of the dC/dV value is small between the one end E1 and the other end E2 of the active portion Ac. That is, in the manufacturing method shown in FIG. 5, as described above, the content of Pb in the first precursor layer L1p is higher than the content of Pb in the second precursor layer L2p, so that it is considered that the variation in the content of Pb is suppressed between the one end E1 and the other end E2 of the active portion Ac and the variation in the local dielectric characteristics is suppressed.

In the present embodiment, as described above, the vibration plate 231 includes the first layer 232 which contains $SiO_2$ as a main component, and the second layer 233 which is positioned at a position closer to the piezoelectric body 260 than the first layer 232 and which contains $ZrO_2$ as the main component. Therefore, the second layer 233 suppresses diffusion of Pb contained in the piezoelectric body 260 and the precursor layer to the first layer 232 and the pressure chamber substrate 220.

In order to verify an effect of the present embodiment, piezoelectric devices corresponding to samples 1 to 4 are prepared, and a performance evaluation test of the prepared piezoelectric devices is performed.

The samples 1 to 4 are prepared according to the manufacturing method shown in FIG. 5. Specifically, first, in step S105, the adhesion layer 285 is formed on the second layer 233 of the vibration plate 231. In step S110, the first electrode 270 is formed by sputtering and etching. In step S115, the seed layer 290 is formed by spin-coating the sol containing the raw material of the seed layer 290 on the first electrode 270 and by being fired using an infrared lamp. In step S120, the first precursor layer L1p is formed by spin-coating the sol containing the raw material of the piezoelectric body 260, as the first precursor liquid, on the seed layer 290. In step S125, the first piezoelectric layer L1 is formed by firing the first precursor layer L1p using the infrared lamp. From step S130 to step S145, the second piezoelectric layer L2 is formed to have two layers as the same as the first piezoelectric layer L1. The first piezoelectric layer L1 and each second piezoelectric layer L2 are formed so that the thickness of the first piezoelectric layer L1 and the thickness of each second piezoelectric layer L2 are substantially equal to each other. In step S150, the second electrode 280 is formed by sputtering and etching. As a result, a piezoelectric device including the piezoelectric body 260 made of a total of three layers is prepared. Firing temperatures in step S115, step S125, step S135, and step S145 are 700° C., respectively.

Further, in the sample 1, the molar concentration of Pb in the first precursor liquid is adjusted to 1.21 times the molar concentration of Pb in the second precursor liquid. In the sample 2, the molar concentration of Pb in the first precursor liquid is adjusted to 1.10 times the molar concentration of Pb in the second precursor liquid. In the sample 3, the molar concentration of Pb in the first precursor liquid is adjusted to 1.30 times the molar concentration of Pb in the second precursor liquid. In the sample 4, the molar concentration of Pb in the first precursor liquid is the same as the molar concentration of Pb in the second precursor liquid, and the sample 4 is prepared by making other conditions be the same as in the cases of the samples 1 to 3. The molar amount of Pb in the first precursor liquid and the molar amount of Pb in the second precursor liquid are adjusted so that the total amount of Pb contained in the piezoelectric body 260 is equal from the sample 1 to the sample 4.

In each sample, the amount of displacement of the vibration plate 231 is measured using a laser doppler vibrometer. A voltage of ±22 V (1 kHz) is applied to the piezoelectric layer (between the first electrode and the second electrode) by a sine wave, and the maximum value of the amount of displacement of the vibration plate 231 when the voltage is applied is the amount of displacement of the vibration plate 231 in each sample.

A dC/dV value of each sample is measured by sMIM. A sample for sMIM is prepared by cutting a flake of each sample with a focused ion beam (FIB) and polishing the cut flake. Specifically, first, the flake at which a cross section along the first direction of the active portion Ac of each sample is exposed is cut by the focused ion beam (FIB). Further, the sample for sMIM is prepared by fixing the cut flake on a SUS stage with silver (Ag) paste and performing chemical-mechanical polishing (CMP) on the flake. While scanning the surface of the prepared sample for sMIM along the first direction with the SPM probe, the sample is irradiated with a microwave of 3.0 GHz via the probe, and a reflected wave from the sample is detected via the probe. At this time, by applying the AC voltage to the sample, the change in the capacitance of the sample with respect to the change in the AC voltage applied to the sample is measured as the dC/dV value for each position in the thickness direction of the sample. As SPM, an atomic force microscope manufactured by Agilent Technologies, Inc. is used. A performance network analyzer (PNA) manufactured by Agilent Technologies, Inc. is used to measure the dC/dV value.

In a performance test evaluation, evaluation is performed by normalizing the dC/dV value of each sample. Specifically, the dC/dV value of each sample is normalized by measuring the dC/dV value in a sample for normalization in advance as the same as in the measurement of the dC/dV value of each sample while manipulating the (111) plane of the sapphire single crystal substrate as the sample for normalization using the SPM probe, and dividing the dC/dV value of each measured sample by the dC/dV value in the sample for normalization. Hereinafter, the dC/dV value normalized as above may be referred to as a "normalized dC/dV value".

Further, for each sample, the change width of the dC/dV value in the second direction between the one end E1 and the other end E2 is calculated in the active portion Ac. Specifically, when the minimum value of the normalized dC/dV value between the one end E1 and the other end E2 of the active portion Ac is m and the maximum value is M, (M−m)/m is the change width.

Figure 6:
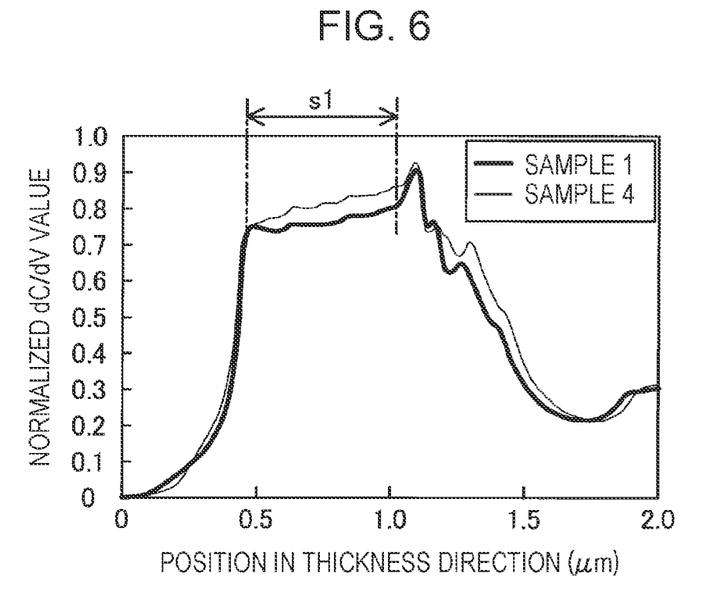
FIG. 6 is a graph in which a horizontal axis indicates a position in a thickness direction of the piezoelectric device and a vertical axis indicates a normalized dC/dV value.

FIG. 6 is a graph in which a horizontal axis indicates a position in the thickness direction of the piezoelectric device and a vertical axis indicates the normalized dC/dV value. FIG. 6 shows, in samples 1 and 4, a relationship between the position of the piezoelectric device in the first direction and the normalized dC/dV value. FIG. 6 shows a section s1 in which the active portion Ac is formed in the thickness direction of the piezoelectric device. The section s1 is determined based on measurement data of a cross-sectional shape of the piezoelectric device. The measurement data of the cross-sectional shape shows a change in dimension in the second direction for each position in the first direction, which is detected by the probe that scans the cross section of the piezoelectric device during dC/dV measurement. Further, the "position in the thickness direction of the piezoelectric device" shown in FIG. 6 increases in a value toward a direction opposite to the forward direction of the first direction.

Figure 7:
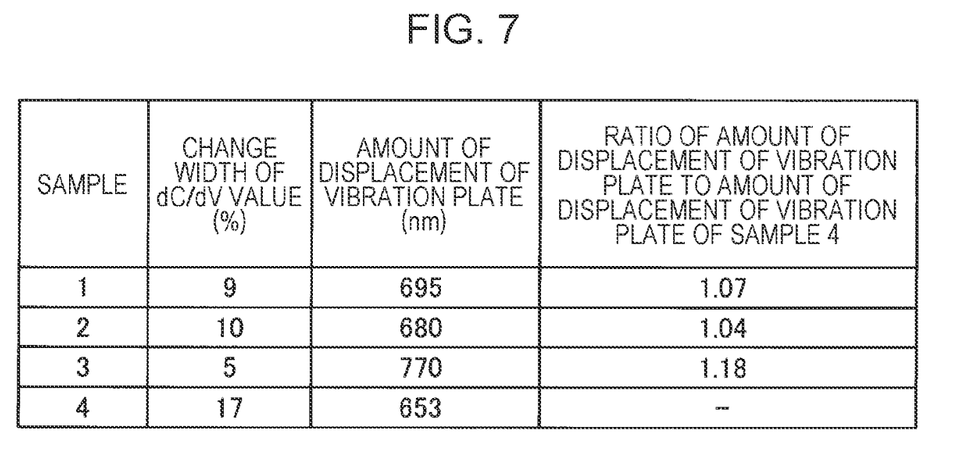
FIG. 7 is a table showing results of a performance evaluation test.

FIG. 7 is a table showing results of the performance evaluation test. FIG. 7 shows the change width of the dC/dV value, the amount of displacement of the vibration plate, and a ratio of the amount of displacement of the vibration plate to the amount of displacement of the vibration plate of sample 4 in sample 1 to sample 4. As shown in FIG. 6 and FIG. 7, the change width of the dC/dV value in the sample 1 to the sample 3 is less than the change width of the dC/dV value in sample 4, that is, 10% or less. Further, as shown in FIG. 7, when the sample 1 to the sample 3 are compared, the change width of the dC/dV value decreases in the order of the sample 3, the sample 1, and the sample 2. In the sample 1 to the sample 3, it is considered that the variation in the content of Pb is suppressed between the one end E1 and the other end E2 of the active portion Ac, and the variation in the local dielectric characteristics is suppressed. Further, it is considered that, by increasing a magnification of the molar concentration of Pb in the first precursor layer L1$p$ with respect to the molar concentration of Pb in the second precursor layer L2$p$, the variation in the content of Pb is further suppressed between the one end E1 and the other end E2 in the active portion Ac, and the variation in the local dielectric characteristics is further suppressed.

Further, displacement of the vibration plate in the sample 1 to the sample 3 is larger than the displacement of the vibration plate in the sample 4. Further, when the sample 1 to the sample 3 are compared, the amount of displacement of the vibration plate is larger in the order of the sample 3, the sample 1, and the sample 2. That is, the less the change width of the dC/dV value, the larger the amount of displacement of the vibration plate. Therefore, as the change width of the dC/dV value is small, the amount of deformation of the piezoelectric body 260 due to the piezoelectric distortion is improved. Further, in the sample 1 to the sample 3, the amount of displacement of the vibration plate is improved by 3% or more as compared with the sample 4, and it is considered that the amount of deformation due to the piezoelectric distortion is improved effectively by causing the change width of the dC/dV value to be 10% or less.

From the results shown in FIG. 6 and FIG. 7, in the piezoelectric device in which the change width of the dC/dV value is 10% or less, it is confirmed that the amount of deformation of the piezoelectric body 260 due to the piezoelectric distortion is improved as compared with the piezoelectric device in which the change width of the dC/dV value exceeds 10%. Further, when manufacturing the piezoelectric device, it is confirmed that the piezoelectric device, which includes the piezoelectric body 260 whose change width of the dC/dV value is 10% or less, can be manufactured by adjusting the molar concentration of Pb in the first precursor layer from 1.10 times to 1.30 times the molar concentration of Pb in the second precursor layer.

According to the piezoelectric device according to the present embodiment described above, the change width of the dC/dV value in the second direction between the one end E1 and the other end E2 of the active portion Ac is 10% or less. As a result, as compared with the piezoelectric device in which the change width of the dC/dV value in the active portion Ac exceeds 10%, the amount of deformation of the piezoelectric body 260 due to the piezoelectric distortion is improved, and the amount of displacement of the vibration plate 231 is improved. Therefore, for example, when the piezoelectric device is provided in the liquid discharge head 200 of the liquid discharge device 100, it is possible to improve the amount of liquid discharged by driving the piezoelectric device.

Further, in the present embodiment, the piezoelectric body 260 contains PZT as a main component. Therefore, it is possible to further improve the amount of deformation of the piezoelectric body 260, which generally has high piezoelectric characteristics as compared with other piezoelectric bodies and which contains PZT as a main component, due to the piezoelectric distortion.

Further, in the present embodiment, the Zr ratio in the piezoelectric body 260 is 0.52 or less. Therefore, the amount of deformation of the piezoelectric body 260 due to the piezoelectric distortion is improved as compared with the case where the Zr ratio exceeds 0.52.

Further, in the present embodiment, the first layer 232 of the vibration plate 231 is a flexible layer containing $SiO_2$ as a main component, and the second layer 233 is an insulating layer containing $ZrO_2$ as a main component. Therefore, the flexibility of the vibration plate 231 is secured by the first layer 232, and the diffusion of Pb from the precursor layer of the piezoelectric body 260 and the piezoelectric body 260 to the vibration plate 231 is suppressed by the second layer 233, so that the change width of the dC/dV value in the active portion Ac tends to be smaller.

Further, in the present embodiment, the piezoelectric body 260 contains crystals having a columnar structure with the Z direction as the longitudinal direction. Therefore, for example, a withstand voltage of the piezoelectric body 260 is improved, as compared with the case where the piezoelectric body 260 contains only granular crystals without containing the columnar crystals.

In another embodiment, when the change width of the dC/dV value between the one end E1 and the other end E2 of the active portion Ac does not exceed 10%, the molar amount of Pb at the one end E1 may be larger than the molar amount of Pb at the other end E2. The Pb contained in the piezoelectric body 260 is gradually diffused to other members by repeatedly applying a voltage to the piezoelectric body 260. In particular, since a large number of members are disposed in the −Z direction of the piezoelectric body 260 as compared with the +Z direction of the piezoelectric body 260, Pb contained in the piezoelectric body 260 tends to be diffused in the −Z direction. Therefore, when the amount of Pb at the one end E1 of the active portion Ac is larger than the amount of Pb at the other end E2 and the piezoelectric device is used repeatedly, the change width of the dC/dV value in the active portion Ac tends to be secured to not exceed 10%, so that the life of the piezoelectric device is further extended. The amount of Pb at one end E1 and the other end E2 of the active portion Ac can be measured and compared by performing energy dispersive X-ray analysis (EDX).

B. Second Embodiment

Figure 8:
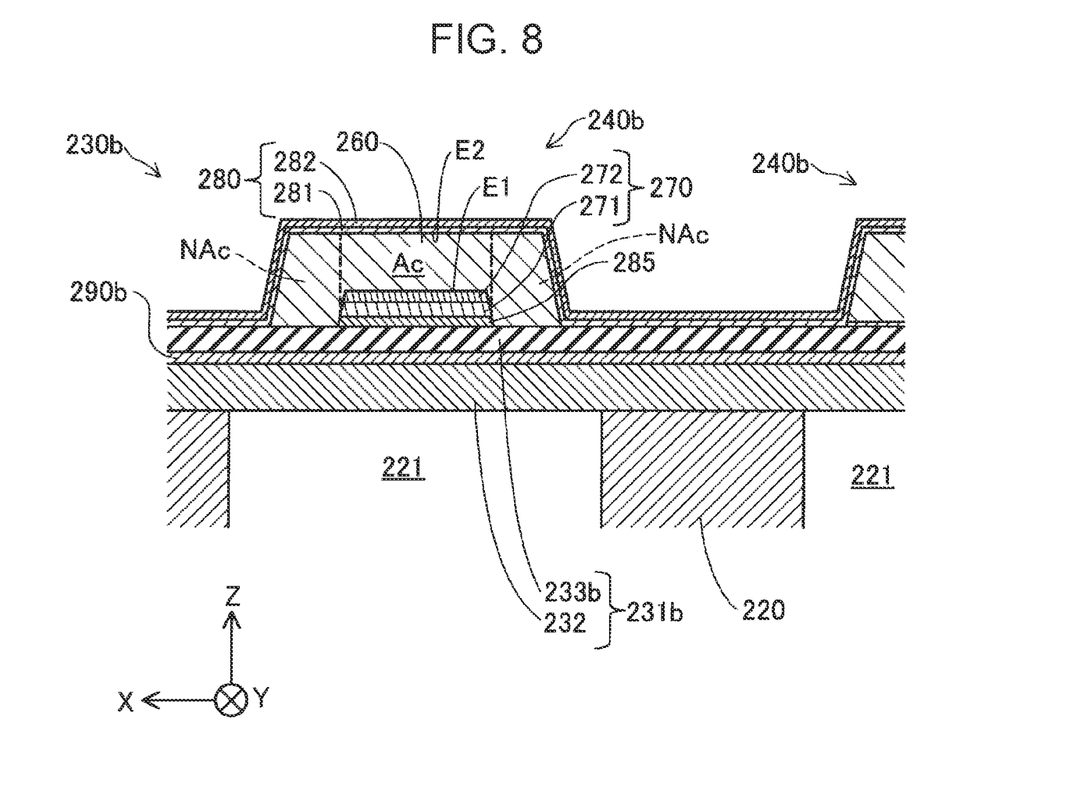
FIG. 8 is a diagram showing a cross section of a pressure chamber and a piezoelectric portion according to a second embodiment.

FIG. 8 is a diagram showing a cross section of a pressure chamber 221 and a piezoelectric portion 230$b$ according to a second embodiment. In a piezoelectric element 240$b$ of the piezoelectric portion 230$b$ according to the present embodiment, unlike the first embodiment, a seed layer 290$b$ is provided between a first layer 232 and a second layer 233$b$ of a vibration plate 231$b$ at a position where overlaps the active portion Ac in the X direction and the Y direction. In the present embodiment, the seed layer 290$b$ is also provided between the first layer 232 and the second layer 233$b$ at a position where overlaps an inactive portion NAc in the X direction and the Y direction and a position where does not overlap a piezoelectric body 260 in the X direction and the Y direction. Further, in configurations of a liquid discharge device 100, a liquid discharge head 200, and the piezoelectric portion 230b according to the second embodiment, points that are not particularly described are the same as in the first embodiment.

As in the present embodiment, even when the seed layer 290b is provided between the first layer 232 and the second layer 233b, the orientation of the piezoelectric body 260 formed on the second layer 233b can be controlled, and the piezoelectric body 260 can be preferentially oriented to the (100) plane. For example, when the lattice constant a=0.398 of LNO is multiplied by a square root of 2, 0.563 is obtained and the lattice constant of $ZrO_2$ is a=0.514 nm. Therefore, when the seed layer 290b is made of LNO, the second layer 233b made of $ZrO_2$ can be preferentially oriented to the (100) plane on the seed layer 290b in a state in which the second layer 233b is rotated by 45 degrees with respect to an a-axis and a b-axis of an LNO crystal on a plane along the a-axis and the b-axis of LNO crystals. Further, when the lattice constant a=0.392 of Pt is multiplied by a square root of 2, 0.554 is obtained. Therefore, a Pt layer 271 can be preferentially oriented to the (100) plane on the second layer 233b preferentially oriented to the (100) plane in a state in which the Pt layer 271 is rotated by 45 degrees with respect to an a-axis and a b-axis of $ZrO_2$ on a plane along the a-axis and the b-axis of the $ZrO_2$. Further, since the lattice constant of Ir is a=0.384 nm, a first Ir layer 272 can be preferentially oriented to the (100) plane on the Pt layer that is preferentially oriented to the (100) plane. In addition, when the above-described additives are not included, the lattice constant a of PZT becomes a value between the lattice constant a of $PbTiO_3$=0.391 nm and the lattice constant a of $PbZrO_3$=0.416 nm according to a composition of Ti and Zr which are contained in PZT. Further, even when PZT contains the above-described additives, the lattice constant is substantially the same as when PZT does not contain the additives. Therefore, the piezoelectric body 260 made of PZT can be preferentially oriented to the (100) plane on a first electrode 270 which is preferentially oriented to the (100) plane. Even when the seed layer 290b is not LNO but, for example, BTO, the piezoelectric body 260 can be preferentially oriented to the (100) plane in the same manner.

As described above, when the piezoelectric body 260 made of PZT is formed by the liquid phase method, Pb contained in the precursor layer is diffused to the first electrode 270 formed prior to the precursor layer, the vibration plate 231b, the adhesion layer 285, the seed layer 290b, and the like in the step of firing the precursor layer of the piezoelectric body 260. With regard to the diffusion of Pb from the precursor layer to other members, Pb tends to be more diffused to a material having a lattice constant close to the lattice constant of PZT consisting of the piezoelectric body 260. Therefore, as in the present embodiment, the diffusion of Pb from the precursor layer to the seed layer 290b can be suppressed by providing the seed layer 290b between the first layer 232 and the second layer 233b, as compared with a case where the seed layer 290b is provided at a position closer to the piezoelectric body 260 than the second layer 233b.

When the piezoelectric device according to the present embodiment is manufactured, after the seed layer 290b is formed on the first layer 232, the second layer 233b is formed on the seed layer 290b, and the first electrode 270 and the piezoelectric body 260 are formed on the second layer 233b. In this case, each member can be formed using the same method as in the step of manufacturing the piezoelectric device according to the first embodiment shown in FIG. 5. Further, when the adhesion layer 285 is formed, the adhesion layer 285 can be formed on the second layer 233b as the same as in the first embodiment.

The above-described piezoelectric device according to the present embodiment also increases the amount of deformation of the piezoelectric body 260 due to piezoelectric effect, and increases the amount of displacement of the vibration plate 231b. In particular, in the present embodiment, the seed layer 290b is provided between the first layer 232 and the second layer 233b at the position where overlaps the active portion Ac in the X direction and the Y direction. As a result, as compared with the case where the piezoelectric body 260 is preferentially oriented to the (100) plane by the seed layer 290b and the seed layer 290b is provided at the position closer to the piezoelectric body 260 than the second layer 233b, the diffusion of Pb from the precursor layer to the seed layer 290b can be suppressed. Therefore, the variation in the content of Pb is further suppressed between the one end E1 and the other end E2 of the active portion Ac, and the change width of the dC/dV value in the active portion Ac tends to be smaller.

In another embodiment, the seed layer 290b may be provided between the vibration plate 231 and the first electrode 270, for example, at the position where overlaps the active portion Ac in the X direction and the Y direction. Even in this case, as the same as in the second embodiment, the first electrode 270 and the piezoelectric body 260 can be preferentially oriented to the (100) plane. Further, even in this case, the seed layer 290b may be provided between the vibration plate 231 and the first electrode 270 even at the position where overlaps the inactive portion NAc in the X direction and the Y direction and the position where does not overlap the piezoelectric body 260 in the X direction and the Y direction, as the same as in the second embodiment.

C. Other Embodiments (C-1) In the above embodiment, the vibration plate 231 includes, in the first direction, the first layer 232 made of $SiO_2$, and the second layer 233 positioned at the position closer to the piezoelectric body 260 than the first layer 232 and made of $ZrO_2$. On the other hand, for example, the first layer 232 may be composed of $ZrO_2$ and the second layer 233 may be composed of $SiO_2$. Further, the vibration plate 231 may include, for example, only a flexible layer. Further, the vibration plate 231 may have three or more layers.

(C-2) In the above embodiment, the piezoelectric body 260 contains crystals having a columnar structure. On the other hand, the piezoelectric body 260 may not contain the crystals having the columnar structure. In this case, the piezoelectric body 260 may have, for example, only granular crystals.

(C-3) In the above embodiment, in step S115 of the step of manufacturing the piezoelectric device shown in FIG. 5, the seed layer 290 is formed, in the X direction and the Y direction, at the position where overlaps the active portion Ac and the position where overlaps the inactive portion NAc. On the other hand, the seed layer 290 may be formed only at the position where overlaps the active portion Ac or only at the position where overlaps the inactive portion NAc.

(C-4) In the above embodiment, the seed layer 290 has the perovskite structure, and includes a complex oxide that is self-oriented to the (100) plane. On the other hand, the seed layer 290 may not have the perovskite structure. Further, the seed layer 290 may not be self-oriented to the (100) plane, and may be self-oriented to, for example, the (110) plane or the (111) plane. In this case, the piezoelectric body 260 may be preferentially oriented to, for example, the (110) plane or the (111) plane. Further, the piezoelectric device may not include the seed layer 290. In this case, in the method for manufacturing the piezoelectric device shown in FIG. 5, step S115 is omitted, and, in step S120, the first piezoelectric layer L1 is formed on, for example, an upper surface of the first electrode 270. Further, in this case, the piezoelectric body 260 may be preferentially oriented to a specific surface or may not be preferentially oriented to the specific surface.

(C-5) In the above embodiment, the first electrode 270 is the individual electrode and the second electrode 280 is the common electrode. On the other hand, the first electrode 270 may be the common electrode and the second electrode 280 may be the individual electrode.

(C-6) In the above embodiment, the piezoelectric device includes the adhesion layer 285. On the other hand, the piezoelectric device may not include the adhesion layer 285. In this case, in the method for manufacturing the piezoelectric device shown in FIG. 5, step S105 is omitted, and, in step S110, the first electrode 270 is formed on an upper surface of the vibration plate 231.

(C-7) In the above embodiment, when the piezoelectric device is manufactured, the vibration plate 231 and the first electrode 270 are formed. On the other hand, for example, an intermediate component in which the vibration plate 231 and the first electrode 270 are formed may be prepared. In this case, the adhesion layer 285 and the seed layer 290 may be formed in the intermediate component.

(C-8) In the above embodiment, in step S120 and step S125 which are the steps of manufacturing the piezoelectric device shown in FIG. 5, the first piezoelectric layer L1 is not formed at the position where does not overlap the first electrode 270 in the X direction and the Y direction on the vibration plate 231. On the other hand, the first piezoelectric layer L1 may be formed at the position where does not overlap the first electrodes 270 in the X direction and the Y direction on the vibration plate 231. In this case, in step S130 and step S135, the second piezoelectric layer L2 is formed on the upper surface of the first piezoelectric layer L1 even in the area which does not overlap the first electrodes 270 in the X direction and the Y direction.

(C-9) In the above embodiment, the piezoelectric body 260 contains PZT as a main component. On the other hand, the piezoelectric body 260 may contain, for example, another kind of ceramic material having a so-called perovskite structure represented by an $ABO_3$ type, for example, barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, lead scandium niobate, and the like as main components. Further, piezoelectric ceramics may be contained as a main component by containing a plurality of PZT and the above-described materials.

D. Other Aspects

The present disclosure is not limited to the above-described embodiments, and can be realized in various aspects without departing from the gist thereof. For example, the present disclosure can also be realized in the following aspects. Technical features in the embodiments corresponding to technical features in respective aspects described below can be appropriately replaced or combined in order to solve some or all of the problems of the present disclosure, or achieve some or all of the effects of the present disclosure. Further, when the technical features are not described as essential in the present specification, the technical features can be appropriately deleted.

(1) According to a first aspect of the present disclosure, a piezoelectric device is provided. This piezoelectric device includes a piezoelectric body that contains piezoelectric ceramics as a main component, a vibration plate that vibrates when the piezoelectric body is driven, a first electrode positioned between the piezoelectric body and the vibration plate, and a second electrode positioned to be separated from the first electrode by the piezoelectric body. The piezoelectric body has an active portion that is a part sandwiched between the first electrode and the second electrode in the first direction along the thickness direction of the piezoelectric body, and a change width of a dC/dV value, which represents a change in capacitance with respect to a change in a voltage applied along a second direction orthogonal to the first direction, from one end of the active portion on a side of the first electrode to the other end of the active portion on a side of the second electrode in the first direction is 10% or less.

According to the aspect, the amount of deformation of the piezoelectric body due to the piezoelectric distortion is improved as compared with the piezoelectric device in which the change width of the dC/dV value in the active portion exceeds 10%. Therefore, the amount of displacement of the vibration plate in the piezoelectric device is improved.

(2) In the piezoelectric device according to the aspect, the piezoelectric body may contain a perovskite-type complex oxide represented by a general formula $ABO_3$ containing Pb, Zr and, Ti, as a main component. According to the aspect, it is possible to further improve the amount of deformation of the piezoelectric body, which generally has high piezoelectric characteristics as compared with other piezoelectric bodies and which contains lead zirconate titanate-based complex oxide as a main component, due to piezoelectric distortion.

(3) In the piezoelectric device according to the aspect, a ratio of the molar amount of Zr to the total of the molar amount of Zr and the molar amount of Ti in the piezoelectric body may be 0.52 or less. According to the aspect, as compared with the case where the ratio of the molar amount of Zr to the total of the molar amount of Zr and the molar amount of Ti exceeds 0.52, the amount of deformation of the piezoelectric body due to the piezoelectric distortion is improved.

(4) In the piezoelectric device according to the aspect, in the active portion, the molar amount of Pb at the one end may be larger than the molar amount of Pb at the other end in the first direction. According to the aspect, when the piezoelectric device is used repeatedly, the change width of the dC/dV value in the active portion tends to be secured to not exceed 10%. Therefore, the life of the piezoelectric device is extended.

(5) In the piezoelectric device according to the aspect, the vibration plate may include, in the first direction, a first layer that contains $SiO_2$ as a main component, and a second layer that is positioned at a position closer to the piezoelectric body than the first layer and contains $ZrO_2$ as a main component. According to the aspect, flexibility of the vibration plate is secured by the first layer, and diffusion of Pb from a precursor layer for forming the piezoelectric body and the piezoelectric body to the vibration plate is suppressed by the second layer, so that the change width of the dC/dV value tends to be smaller.

(6) The piezoelectric device according to the aspect may further include a seed layer oriented to a (100) plane between the first layer and the second layer at a position where overlaps the active portion. According to the aspect, the diffusion of Pb from the precursor layer to the seed layer can be suppressed as compared with a case where the piezoelectric body is preferentially oriented to the (100) plane by the seed layer and the seed layer is provided at a position closer to the piezoelectric body than the second layer. Therefore, the variation in the content of Pb is further suppressed between the one end and the other end in the first direction of the active portion, and the change width of the dC/dV value in the active portion tends to be smaller.

(7) In the material delivery device according to the aspect, the piezoelectric body may contain crystals having a columnar structure with a direction along the first direction as a longitudinal direction. According to the aspect, for example, a withstand voltage of the piezoelectric body is improved as compared with the case where the piezoelectric body does not contain the columnar crystals but contains only granular crystals.

(8) According to a second aspect of the present disclosure, a liquid discharge head is provided. The liquid discharge head includes the piezoelectric device according to the first aspect and a pressure chamber through which liquid flows, and is configured to discharge the liquid in the pressure chamber when the piezoelectric device is driven. According to the aspect, the amount of deformation of the piezoelectric body due to the piezoelectric distortion is improved as compared with the piezoelectric device in which the change width of the dC/dV value in the active portion exceeds 10%. Therefore, the amount of displacement of the vibration plate is improved in the piezoelectric device, and the discharge amount of the liquid is improved by driving the piezoelectric device.

(9) According to a third aspect of the present disclosure, a liquid discharge device is provided. The liquid discharge device includes the liquid discharge head according to the second aspect, and a controller that controls a discharge operation from the liquid discharge head. According to the aspect, the amount of deformation of the piezoelectric body due to the piezoelectric distortion is improved as compared with the piezoelectric device in which the change width of the dC/dV value in the active portion exceeds 10%. Therefore, the amount of displacement of the vibration plate is improved in the piezoelectric device, and the discharge amount of the liquid is improved by driving the piezoelectric device.

(10) According to a fourth aspect of the present disclosure, a method for manufacturing a piezoelectric device is provided which includes a vibration plate, a first electrode, a piezoelectric body, and a second electrode laminated in order along a forward direction of a first direction and in which the piezoelectric body contains a perovskite-type complex oxide represented by a general formula $ABO_3$ containing Pb, Zr and, Ti, as a main component. This manufacturing method includes a first step of forming a first precursor layer in the forward direction of the first electrode and forming a first piezoelectric layer of the piezoelectric body by firing the first precursor layer; a second step of laminating a plurality of second piezoelectric layers in the forward direction by alternately executing a step of forming a second precursor layer in the forward direction of the first piezoelectric layer and a step of forming the second piezoelectric layer of the piezoelectric body by firing the second precursor layer a plurality of times; and a third step of forming the second electrode in the forward direction of the piezoelectric body. A molar concentration of Pb in the first precursor layer is 1.10 to 1.30 times a molar concentration of Pb in the second precursor layer.

According to the aspects, as compared with the piezoelectric device in which the change width of the dC/dV value in the active portion is 10% or less and the change width of the dC/dV value in the active portion exceeds 10%, it is possible to manufacture the piezoelectric device having the piezoelectric body in which the amount of deformation due to the piezoelectric distortion is large.

What is claimed is:

1. A piezoelectric device comprising:
    a piezoelectric body;
    a vibration plate that vibrates when the piezoelectric body is driven;
    a first electrode positioned between the piezoelectric body and the vibration plate; and
    a second electrode positioned to be separated from the first electrode by the piezoelectric body, wherein
    the piezoelectric body includes an active portion that is a part sandwiched between the first electrode and the second electrode in a first direction along a thickness direction of the piezoelectric body,
    when a change in capacitance with respect to a change in a voltage applied along a second direction orthogonal to the first direction regards as a dC/dV value,
    the dC/dV value at a first position in the first direction is larger than 0,
    the dC/dV value at a second position in the first direction is larger than 0 and different from the dc/dV value at the first position, the second position being different from the first position in the first direction, and
    a change width of the dC/dV value from one end of the active portion on a side of the first electrode to the other end of the active portion on a side of the second electrode in the first direction is 10% or less.

2. The piezoelectric device according to claim 1, wherein the piezoelectric body contains a perovskite-type complex oxide, which is represented by a general formula $ABO3$ containing Pb, Zr and, Ti, as a main component.

3. The piezoelectric device according to claim 2, wherein a ratio of a molar amount of Zr to a total of the molar amount of Zr and a molar amount of Ti in the piezoelectric body is 0.52 or less.

4. The piezoelectric device according to claim 2, wherein a molar amount of Pb at the one end is larger than a molar amount of Pb at the other end.

5. The piezoelectric device according to claim 2, wherein the vibration plate includes, in the first direction, a first layer that contains $SiO2$ as a main component, and a second layer that is positioned at a position closer to the piezoelectric body than the first layer and contains $ZrO2$ as a main component.

6. The piezoelectric device according to claim 5, further comprising:
    a seed layer oriented to a (100) plane between the first layer and the second layer at a position where overlaps the active portion.

7. The piezoelectric device according to claim 1, wherein the piezoelectric body contains crystals having a columnar structure.

8. A liquid discharge head comprising:
    the piezoelectric device according to claim 1; and
    a pressure chamber through which liquid flows, wherein the liquid in the pressure chamber is discharged when the piezoelectric device is driven.

9. A liquid discharge device comprising:
the liquid discharge head according to claim 8; and
a controller that controls a discharge operation from the liquid discharge head.

10. The piezoelectric device according to claim 1, wherein a normalized dC/dV value is greater than 0.7 and less than 0.9 over a position in the thickness direction of the piezoelectric body ranging from about 0.5 μm to about 1.0 μm.

11. The piezoelectric device according to claim 1, wherein each of the first electrode and the second electrode is a laminate comprising at least an iridium layer.

* * * * *